United States Patent [19]

Giallorenzi

[11] 4,185,274
[45] Jan. 22, 1980

[54] HIGH-SPEED ELECTROOPTICAL A/D CONVERTER

[75] Inventor: Thomas G. Giallorenzi, Springfield, Va.

[73] Assignee: The United States of America as represented by the Secretary of the Navy, Washington, D.C.

[21] Appl. No.: 923,857

[22] Filed: Jul. 12, 1978

[51] Int. Cl.² ............................................. H03K 13/02
[52] U.S. Cl. .............................. 340/347 P; 250/232; 350/46.1; 350/355; 350/356; 340/347 AD; 340/347 M
[58] Field of Search ....... 340/347 M, 347 P, 347 AD; 350/96.13, 96.1, 96.14, 355, 356, 358, 271; 250/232

[56] References Cited

U.S. PATENT DOCUMENTS

| | | | |
|---|---|---|---|
| 2,090,713 | 8/1937 | Wilson | 250/232 X |
| 2,729,701 | 1/1956 | Levy | 340/347 P |
| 2,733,410 | 1/1956 | Goodall | 340/347 P |
| 2,791,764 | 5/1957 | Gray | 340/347 P |
| 3,521,271 | 7/1970 | Rappaport | 340/347 P |
| 3,526,880 | 9/1970 | Filippazzi | 350/96.1 X |
| 3,610,941 | 10/1971 | West | 350/96.1 X |
| 3,781,868 | 12/1973 | Huber | 340/347 P |
| 4,005,408 | 1/1977 | Taylor et al. | 340/347 P |

OTHER PUBLICATIONS

Tsai et al., Ultrafast Guided-Light Beam Deflection/-Switching and—, Applied Physics Letters, vol. 27, No. 4, Aug. 15, 1975, pp. 248-250.
Tien et al., Light Beam Scanning and Deflection in Epitaxial—, Applied Physics Letters, vol. 25, No. 10, Nov. 15, 1974, pp. 563-565.

Primary Examiner—Thomas J. Sloyan
Attorney, Agent, or Firm—R. S. Sciascia; Philip Schneider; Melvin L. Crane

[57] ABSTRACT

An electrooptical analog-to-digital (A/D) converter. A laser beam is coupled into a waveguide which has been fabricated on an electrooptical crystal such as a lithium niobate $LiNbO_3$ crystal. Electrodes are placed relative to the waveguide to form an electrooptical prism and an analog signal is fed to the electrodes. A modulated laser beam passing through the electrooptical prism is deflected in the plane of the waveguide in proportion to the applied analog signal. The deflected beam is expanded in the y-direction by diffraction-spreading or by a beam-spreading lens and falls on a ribbon-fiber, coded detector array. The array effectively codes the analog signal, translating the position of the deflected beam into a coded digital word which is representative of the magnitude of the analog signal.

11 Claims, 1 Drawing Figure

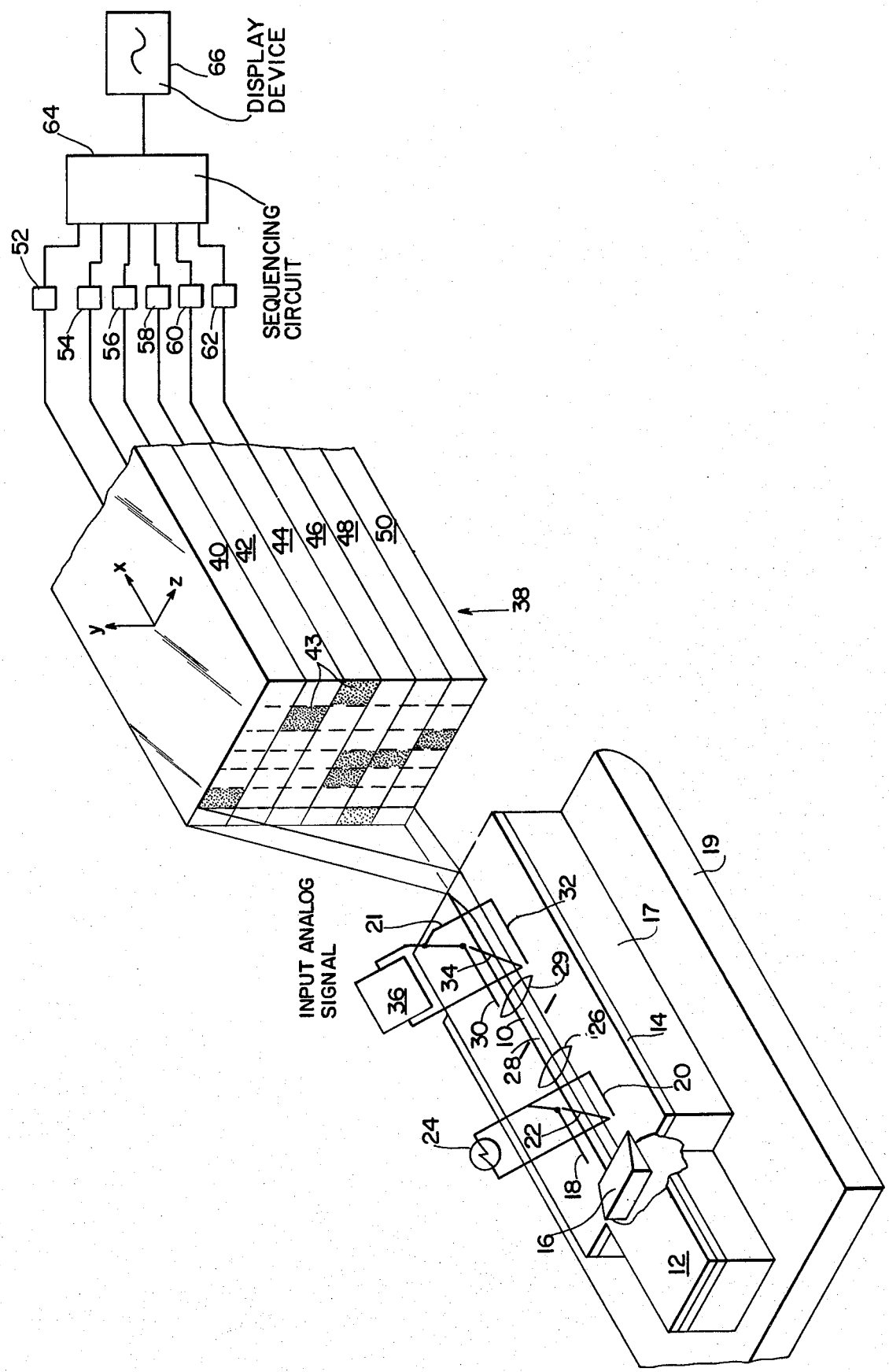

HIGH-SPEED ELECTROOPTICAL A/D CONVERTER

BACKGROUND OF THE INVENTION

This invention relates to A/D converters and, more particularly, to an electrooptical A/D converter which provides a high-speed, accurate conversion.

Heretofore, there have been various electrical systems for converting an analog signal to a digital output. Electrical A/D converter systems made on silicon substrates appear to be slower than electrooptic systems and they require more power. Efforts have been made to develop higher speed A/D converters using GaAs micro-electronic devices; however, these efforts are still in an early state of development and have not produced high-speed, high-accuracy devices to date. Another electrooptical A/D converter has been set forth by H. F. Taylor in an article "An Electrooptic Analog-to-Digital Converter," Proceedings of the IEEE, #63, pp. 1524–1525, October 1975. This device uses a plurality of channel waveguide modulators to convert electrical analog signals to digital signals. This A/D converter potentially offers high resolution and high speed of operation. However, it suffers a severe fabricational problem in forming precise channels and in coupling light into the channels.

SUMMARY OF THE INVENTION

The present device converts an analog signal to a digital output by use of an optical waveguide and optical elements in combination with a ribbon-fiber, coded, light-detector array that converts the detected light to digital electrical outputs. The light through the waveguide is controlled by the analog signals so that the light is deflected to a specific column of aligned, coded, ribbon-fiber ends in accordance with the potential of the applied analog signal. The output of separate detectors, each of which is associated with a different ribbon fiber, is arranged to form a digital word which describes the position of the beam and thereby the magnitude of the applied analog signal voltage.

The control is instantaneous and the resolution capability is high. The device does not suffer from any fabricational problems of the prior electrooptical A/D converter art and is simple in construction.

BRIEF DESCRIPTION OF THE DRAWING

The drawing illustrates an A/D converter system made in accordance with the teaching of this invention.

DETAILED DESCRIPTION

The output beam 10 of a continuous wave laser 12 is coupled into a waveguide 14 via a coupling element 16. The coupling element may be any well-known type used for coupling light into an optical waveguide such as a prism, grating, end-fire coupler, tapered edge, etc. A prism coupler is shown. The waveguide is formed on an electrooptic crystal 17, made from a material such as lithium niobate ($LiNbO_3$), which is assembled on a heat sink 19. As is well known in the art, the waveguide is formed by a layer of optical material which has a higher index-of-refraction than that of the substrate. The waveguide has two operational sections—a laser radiation switch section and a beam deflector section. The laser switch section includes an electrooptic prism structure for modulating the laser beam. The electrooptic prism structure includes parallel electrodes 18 and 20 placed on each side of the path of a laser beam coupled into the waveguide. A third electrode 22 is placed at an angle between electrodes 18 and 20 and a light-modulating signal is applied to the electrodes. One side of the modulator 24 is electrically connected to each of the parallel electrodes and the other side is electrically connected to the angularly placed electrode. The light-modulating signal changes the index of refraction of the electrooptic material of the waveguide in the vicinity of the electrodes. Changing the index of refraction of the waveguide changes the path of the light beam. The greater the input modulating signal, the greater the change in direction of the light beam. Therefore by applying an increasing, sweeping periodic signal, the light beam is swept back-and-forth in the plane of the waveguide between the electrodes. The modulated light is directed through a lens 26 toward an aperture 28. The sweep of the light beam in the plane of the waveguide is greater than the width of the aperture. Therefore, the modulating signal effectively functions as a switch which samples the laser beam or which changes the continuous wave to fast, short pulses of light beyond the aperture. The electrode structure operates on an electrooptic prism structure which is more adequately explained in the prior art in an article "Ultrafast-Guided-Light Beam Deflection/Switching and Modulation Using Simulated Electro-Optic Prism Structures in $LiNbO_3$ Waveguides" by C. S. Tsai and P. Saunier, *Applied Physics Letters*, Vol. 27, No. 4, Aug. 15, 1975 pp. 248–250.

The modulated light beam that passes through the aperture 28 passes through a lens 29 which directs the light-beam-pulses to the beam-deflector section. The beam-deflector section includes an electrooptic prism structure formed by parallel electrodes 30 and 32, and an angular electrode 34. Signals produced by an analog signal source 36 are electrically connected to the electrooptic prism electrodes. One side of the analog signal source is conneced in parallel to each of the parallel electrodes and the other side is connected to the angularly placed electrode. The analog signal will change the index of refraction of the waveguide material thereby causing the pulsed beam to be deflected at an angle in the plane of the waveguide. The greater the applied analog signal, the greater the effect will be on the index of refraction to change the direction of the light beam. Thus, an applied analog signal will deflect the light beam in the plane of the waveguide and the deflection will be proportional to the applied analog signal. The operation of the electrooptic prism structure is more adequately set forth in the article mentioned above. The light beam pulses from the beam-deflector section are coupled out of the waveguide by any suitable coupling means well known in the art. As shown, the pulses are coupled from the edge of the waveguide by an end-fire coupler. The end edge of the waveguide is formed into the coupler. The light-beam pulse output from the waveguide is deflected along the Z-direction and expands through diffraction-spreading in the y-direction, that is, perpendicular to the plane of the waveguide. Any suitable optics such as a lens may be used for spreading the light in the y-direction. The light so spread in the y-direction will be thin in its dimension along the z-direction.

Since the deflection of the light beam in the z-direction is proportional to the applied analog signal, the location of the light beam at a specific location along the z-direction will determine the magnitude of the analog signal. Therefore means are provided for detecting the deflected light beam and converting the detected light beam into a digital output corresponding to the applied analog signal.

The light beam from the optical waveguide is deflected onto a coded detector array 38 which is formed, as shown, by six ribbon-type optic fibers 40, 42, 44, 46, 48 and 50 placed adjacent each other in a vertical stack. The width of each ribbon fiber (in the z-direction) is sufficient to detect the deflected light beam at its greatest deflection along the z-direction. The height of the stack of ribon fibers is equal to the spread of the beam in the y-direction. The output end of each ribbon fiber is provided with a suitable optical lens configuration or provided with a suitable optical lens adjacent thereto to focus the radiation incident on any portion of its input end to an optical radiation detector 52, 54, 56, 58, 60 and 62, one detector for each ribbon fiber. Suitable photodetectors are PIN diodes, avalanche photodiodes, or photomultipliers.

Since the analog signal causes the radiation beam to be deflected along the z-direction, the output radiation beams from the optical waveguide will be incident on the input end of the coded array at various places along its width. Therefore the end of the ribbon-fiber array is coded to permit differentiation between the different positions of the deflected beam in the z-direction. For this purpose, the ends of the ribbon fibers in the array are coded by use of an opaque material which is applied to the ends of the ribbon fibers in a definite coded order. The opaque material is placed uniformly on the ends of the ribbon fibers to form columns with opaque and light-transmitting areas in the y-direction which contain one or more opaque areas 43. The opaque material is placed on the ends of the ribbon fibers such that the entire width of the ribbon fiber array includes a plurality of side-by-side, y-direction columns, each including opaque and transparent areas. Thus, the radiation deflected in the z-direction will be incident upon one of the coded columns somewhere along its sweep from one edge of the ribbon-fiber array to the other. The incident radiation will enter those ribbon fibers which do not have an opaque area in the incident column and will be blocked from entering ribbon fibers whose ends include the opaque material. The radiation passing through a ribbon fiber will be detected by its detector and the detector for a ribbon fiber which has an opaque end will not detect any radiation. The outputs of the photodetectors are directed to an electronic sequencing circuit 64, whose output is in digital form and can be displayed by a digital display device 66 or used as desired.

If six ribbon fibers are used, as shown, then a coded word will include six digits. The number of digital words depend on the number of vertically aligned columns formed across the end or width of the ribbon fibers. Assuming that a "1" represents a transparent area through which incident light passes, and a "0" represents an opaque area, then a word can include from one to six "1's" and from one to six "0's." Since there is only one light detector optically connected with each ribbon fiber, the composite output of the detectors will be dictated by the code of the vertical column (y-direction) upon which the light beam from the waveguide is incident. The z-direction thickness of the deflected beam is preferably less and, to avoid ambiguity in output signals, is no greater than the width of each coded column. The deflected light beam incident on the end of the detector array, along one column, will be transmitted to the detectors associated with the fiber ribbons except for those ribbon fibers which have an opaque material on their ends in the incident column. Thus, a digital output can be obtained for any analog signal applied to the electrooptic prism structure in the deflection section of the waveguide.

The above description is for a system with which a continuous wave laser is used for the laser beam source. Alternatively, a mode-locked laser may be used in place of the c.w. laser/laser switch combination to form pulses of radiation. In this situation, a train of equidistant, spaced, short pulses for sampling is derived directly from the mode-locked laser.

In operation of the system as shown, light or radiation from a continuous wave (c.w.) laser is coupled into the waveguide. The light beam is directed through the modulating switch section which includes an electrooptic prism structure. A sweeping voltage applied to the electrooptic prism structure deflects the input laser beam back and forth in the plane of the waveguide between electrodes 18 and 20. The deflected beam passes through the optical lens 26 toward the aperture 28. The deflected beam has a greater sweep angle than the size of the aperture. Therefore the laser beam passes through the aperture only as it sweeps across it. Thus, the aperture effectively produces short, fast pulses of light beyond the aperture. The short, fast pulses pass through a lens 29 which directs the pulses to the second electrooptic prism structure. An analog signal 36 is electrically connected to the second electrooptic prism structure which deflects the short, fast pulses in the plane of the waveguide between electrodes 30 and 32 in accordance with the amplitude of the analog signal. The radiation deflected by the electrooptic prism is coupled out of the edge of the waveguide and expanded through diffraction-spreading in the y-direction. The expanded beam is narrow in the z-direction and incident on a coded column in the y-direction across the end-coded ribbon-fiber array formed by transparent and opaque areas on the ends of the ribbon fibers. The ends of the ribbon fibers along the incident column which are not opaque pass the incident radiation to the detector for their respective ribbon fibers. Those ribbon-fiber ends which are opaque, due to a mask-covering, do not pass radiation. Therefore, the radiation detector for each of the ribbon fibers having a transparent end will produce a separate output signal due to incident radiation. Those detectors for the ribbon fibers whose ends are masked will not produce a signal. The detector for each ribbon fiber passing radiation through the array will produce an output signal which is directed to the sequencing circuit. The output from the sequencing circuit will be in digital form in order from the top ribbon fiber to the bottom fiber, a "1" for those detectors receiving light and a "0" for those detectors not receiving light. Therefore the digital output will be representative of the analog signal directed to the electrooptic prism in the deflection section of the waveguide. Assuming that the light beam has been deflected to the left-most column on the drawing, detectors 52, 54, 56, 58 and 62 for ribbon fibers 40, 42, 44, 46 and 50, respectively, will produce a signal and the detector 60 for ribbon fiber 48 will not produce a signal. Therefore the digital word 111101 is generated. Thus, the digital word 111101 will represent the left-most column. Likewise, the right-most column will be represented by the digital word 110111.

The digital word may be displayed by any suitable display equipment.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An ultra-high-speed A/D converter comprising:
   an optical waveguide,
   means for directing fast, short light pulses through said waveguide,
   an electrooptic prism on said waveguide through which said fast, short pulses are directed,
   an analog input signal generator for applying analog signals to said electrooptic prism for deflecting said fast, short pulses of light in the plane of said waveguide,
   a y-direction beam expander for spreading said fast, short pulses of light deflected by said electrooptic prism due to said analog signals,
   a plurality of ribbon fibers stacked upon each other uniformly in the y-direction, said ribbon fibers having a coded input end formed by opaque and transparent areas which form an array of aligned coded columns with said columns extending in the y-direction side-by-side across the input end of said ribbon fibers, and
   radiation detector means for detecting radiation passing through the transparent areas of each ribbon fiber upon which said light deflected from said waveguide is incident.

2. An A/D converter as claimed in claim 1 wherein:
   said means for directing fast, short light pulses through said waveguide includes:
   a laser beam coupler for coupling a laser beam into said waveguide,
   a modulator means for deflecting said light beam in the plane of said waveguide, and
   means for passing only a portion of said light beam through said waveguide to produce fast, short light pulses in said waveguide.

3. An A/D converter as claimed in claim 2 in which:
   said means for passing only a portion of said light beam to produce fast, short light pulses includes;
   an electrooptic prism structure, and
   a slit through which only a portion of the light beam passes.

4. An A/D converter as claimed in claim 3 in which:
   said light beam is formed by a continuous-wave laser.

5. An A/D converter as claimed in claim 1 in which:
   said fast, short light pulses are produced by a mode-locked-laser.

6. An electrooptical A/D signal converter comprising:
   optical waveguide means for transferring light from its input to its output end;
   modulating means to which an analog signal can be applied for deflecting said light in said waveguide in the z-direction, the deflection being proportional to the strength of the modulating signal;
   means for spreading the modulated light in the y-direction;
   optical coded array means, upon which the light output of the waveguide means is directed, comprising light-passing means one end of which is coded by being divided into a predetermined number of opaque and transparent sections to form separate areas which are extended in the Z-direction with respect to each other, each area being coded into a different opaque and transparent pattern so that its light-pattern output is different from that of any other area and consists of said predetermined number of opaque and transparent sections; said optical coded array means comprises a plurality of optical ribbon fibers stacked one upon the other in the y-direction, the z-direction dimension of the fibers being at least equal to the total extent to which the light output of the waveguide means is deflectable; and
   light detector means equal in number to said predetermined number of opaque and transparent sections in any given area, the light output from said coded array means being directed upon said light detector means to provide signal outputs in accordance with the particular area of the array means upon which the modulated light is being directed and therefore in accordance with the strength of the modulating signal, the strength of any given modulating signal thus being digitized into a series of zeroes and ones corresponding to the opaque and light-passing segments, respectively, of the particular area of the coded array upon which the modulating signal deflects the output of the waveguide means.

7. A converter as in claim 6, wherein:
   said fibers are divided into said predetermined number of opaque and transparent sections by placing pieces of opaque material in the appropriate locations at one end of the fiber array.

8. A converter as in claim 1, further including:
   sequencing means, to which the outputs of said detector means is applied, for arranging said outputs in order.

9. A converter as in claim 8, further including:
   display means, to which the output of said sequencing means is applied, for displaying the sequenced signals.

10. An ultra-high-speed A/D converter comprising:
    an optical waveguide for transmitting light from its input end to its output end,
    a laser for producing and directing a light beam into said optical waveguide,
    means for coupling said light beam into said optical waveguide,
    a first light beam deflection-switching and modulation means for sweeping said light beam back and forth in the plane of said optical waveguide,
    a lens in optical alignment with said sweeping light beam,
    a slit in optical alignment with said lens,
    said slit operative in combination with said first light beam deflective-switching and modulation means and said lens to pass only a portion of said sweeping light beam therethrough as fast, short light pulses,
    a second light beam deflection-switching and modulation means in optical alignment with said slit for receiving said fast, short pulses of light,
    an analog input signal generator for applying analog signals to said second light beam deflection-switching and modulation means for deflecting said fast, short pulses of light in the plane of said waveguide,
    a y-direction beam expander for spreading said fast-short pulses of light deflected by said second light-beam deflection-switching and modulation means resulting from application of said analog signals, a plurality of separate ribbon fibers stacked upon each other uniformly in the y-direction, each of said ribbon fibers having a coded light input end formed by opaque and transparent areas which form an array of aligned coded columns with said columns extending in the y-direction side-by-side in the z-direction across the input end of said ribbon fibers; and light detector means equal in number to said separate ribbon fibers with one each in optical alignment with the output end of one each of said ribbon fibers for separately detecting light passing through the transparent areas of y-direction columns across each separate ribbon fiber upon which light deflected from said waveguide is incident.

11. A converter as claimed in claim 10 in which:

the y-direction spread of the light is the same as the height of the stacked ribbon fibers, and the z-direction dimension of the ribbon fibers being at least equal to the total extent to which the light output of the waveguide is deflectable in the z-direction.

* * * * *